May 22, 1962 H. A. WAGNER 3,035,416

THERMOELECTRIC DEVICE

Filed June 28, 1960 2 Sheets-Sheet 1

WITNESSES

Edwin E. Bassler

Frederick Shapoe

INVENTOR

Howard A. Wagner

BY William J. Foley

ATTORNEY

May 22, 1962 H. A. WAGNER 3,035,416

THERMOELECTRIC DEVICE

Filed June 28, 1960 2 Sheets-Sheet 2

WITNESSES

Edwin E. Bassler

Frederick Shapoe

INVENTOR

Howard A. Wagner

BY William J. Foley

ATTORNEY 3,035,416
THERMOELECTRIC DEVICE

Howard A. Wagner, Churchill Boro, Pa., assignor to Westinghouse Electric Corporation, East Pittsburgh, Pa., a corporation of Pennsylvania Filed June 28, 1960, Ser. No. 39,285
8 Claims. (Cl. 62—3)

This invention relates to thermal treatment apparatus and particularly to compact devices for cooling or heating small quantities of substances or small items.

There are many laboratory and other test applications for equipment capable of maintaining a specimen at a predetermined temperature, above or below ambient temperature, while tests are performed on, or measurements made of the sample. Such equipment, particularly that which is used to cool specimens, has in the past been both cumbersome and expensive.

This invention enables thermal treatment devices to be economically constructed in relatively small sizes. In accordance with the invention, utilization is made of small thermoelectric elements, or bodies, capable of effecting transfer of heat between certain electrical current carrying junctions with the elements and other current carrying junctions with the elements. This heat transfer phenomenon is known as the "Peltier Effect."

The thermoelectric bodies for such apparatus are arranged in couples, or pairs, in order to possess the desired heat pumping characteristics, and these couples are connected in a series electrical circuit. A number of electrically and thermally conductive connector members must be provided for conveying electrical current to the several thermoelectric bodies and for conveying heat to and from the connections, or junctions, with these bodies. In accordance with prior practice, the thermoelectric bodies and the conductive members associated therewith were grouped and joined together as an assembly, or array, which was thermally associated with but electrically insulated from those portions of the device between which heat was to be transferred and, moreover, electrically insulated from such other structural members or elements as formed the device. This approach to the design of thermoelectric devices was both complicated and expensive.

The principal object of this invention is the reduction in cost and the simplification of thermal treatment devices utilizing thermoelectric heat pumping means. It is a feature of this invention that various structural components of the device are employed as parts of the electrical conducting system, as well as parts of the heat conducting system of the device, thereby eliminating the necessity of using separate components for these purposes. This concept is based, at least in part, on the realization that the current carrying components of a thermoelectric device need not be isolated from the other components of the device because the low voltage electric current carried thereby affords no substantial danger either to the user of the device or to the substances or items which are to be subjected to thermal treatment by the device.

Specifically, this invention envisions the construction of a thermal treatment device in which the structural shell of the device is made up of a number of rigidly interconnected plates, or panels, which are electrically and thermally connected to the several thermoelectric bodies in such a manner that they form a part of the electrical circuit through the device and, being in an exposed position with respect to ambient air, also function as extended surface heat transfer members for either dissipating heat to or absorbing heat from the ambient air. This invention also envisions carrying this concept a step further and forming the container for the substance, or items, to be treated of a number of parts, or segments, which are likewise electrically and thermally connected to the thermoelectric bodies so as to perform heat conducting and electrical conducting functions in the thermoelectric system. As is described in greater detail hereinafter, suitable means are provided for electrically insulating certain of the shell plates from one another and electrically connecting other shell plates to provide a suitable series electric circuit through the thermoelectric bodies. Similar means associated with the container segments likewise enable the container segments to function as a part of the electrical circuit.

Another feature of the invention concerns a novel form of finned plate structure from which the shell of the device is constructed. A further feature resides in a novel arrangement for supporting the sample, or specimen, container within the shell of the device.

These features, as well as other objects, advantages and features of the invention are described in greater detail in the following detailed description wherein reference is made to the accompanying drawings, forming a part hereof and wherein.

Figure 1:
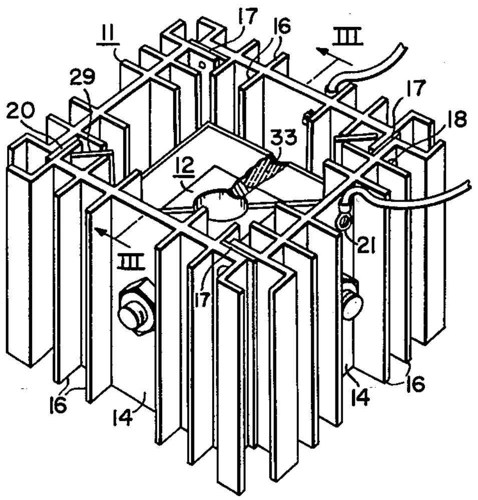
FIG. 1 is a perspective view of a thermal treatment device constructed in accordance with this invention.

The thermal treatment device illustrated in FIG. 1 comprises, generally, a rigid shell 11 which encompasses and supports a container 12 adapted to receive the substance or item to be thermally treated. This device is of relatively small size, such as might be used on a laboratory table or work bench to cool or heat small specimens to a predetermined temperature and to maintain specimens at that temperature for an extended period of time. An integral part of the device is a compact heat pumping system including a plurality of bodies 13 of thermoelectric material. The thermoelectric bodies 13 are disposed within the space between the container 12 and the shell 11 for the purpose of transferring heat between these two subassemblies of the device. When electrically and thermally connected and arranged as described hereinafter, these thermoelectric bodies 13 are capable of removing heat from the container 12 and dissipating this heat through the shell 11 for the purpose of cooling specimens located in the container, and, upon the reversal of electric current through the bodies, are capable of transferring heat from the shell 11 to the container 12 for the purpose of heating specimens in the container.

Small thermoelectric devices of the aforementioned type have been proposed in the past. This invention concerns the manner in which the subassemblies, such as the shell 11 and the container 12, are constructed and the manner in which they are electrically and thermally associated with the thermoelectric bodies 13 to minimize the number of parts used and to otherwise reduce the cost of the device.

It is a feature of this invention that the shell 11 is constructed in such a manner as to not only provide the basic structural housing for the device but further to function both as a heat transfer member in the thermal system of the device and as an integral part of the electrical circuit conveying electric current to and from the thermoelectric bodies 13. It will be observed from FIGS.

1 and 4 that the shell 11 is built up from four plates, or plate-like members, 14, each of which constitutes an upright side wall of the shell. These plates 14 are formed from a material possessing good electrical and heat conducting properties, such as aluminum, and are preferably provided with extended-surface heat transfer fins 16 on both their inner and their outer surfaces. For maximum economy of manufacture, all of the shell plates 14 are identical and may, therefore, be made from a common rolled or extruded section having the fins 16 integral with the main body of the plate.

Each of the shell plates 14 is rigid and the several plates are rigidly connected at their edges to adjoining plates to form an open top and open bottom box-like structure, which is the shell 11. In accordance with the invention, certain adjoining shell plates 14 are electrically insulated from one or both adjoining plates by means of insulating sheets, or strips, indicated at 17. The mechanical connection between the plates 14 at these insulated junctions is provided by electrically insulating screws 18, or other insulating fasteners. Such fasteners may be formed, for example, of any suitably strong, electrically insulating material, such as nylon. The joint between other adjacent plates 14 is rendered electrically conductive through the use of conductive screws or fasteners 19 and, if desired, an electrically conductive shim 20, formed from sheet metal or the like.

Further in keeping with the utilization of the shell plates 14 as a part of the electrical circuit of the device, two adjoining plates are provided with electrical connectors 21 by which the device is provided with electrical current from a suitable direct current supply (not shown).

Each of the shell plates 14 is thermally and electrically connected to a different one of the thermoelectric bodies 13 by means of plugs 22 formed of a material which is a good conductor of both heat and electricity, such as copper. These plugs 22 are preferably soldered or similarly connected to their thermoelectric bodies 13 in such a manner as to provide low electric resistance joints, or junctions 23. In operation of the device, heat is either absorbed or dissipated at the junctions 23 depending upon the direction in which the current flows therethrough. In accordance with this invention, the same electric current which flows through the junctions 23 and the heat dissipated at or absorbed at these junctions are also conveyed to the shell plates 14 via the plugs 22. A good thermal and electrical connection should, therefore, be provided between each of the plugs 22 and its plate 14, which connection may be provided by means of a nut 24 and a threaded stud 25 on each plug 22.

Figure 2:
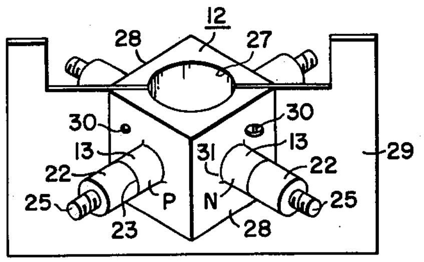
FIG. 2 is a perspective view of the specimen container and associated structure employed in the device of FIG. 1.
Figure 3:
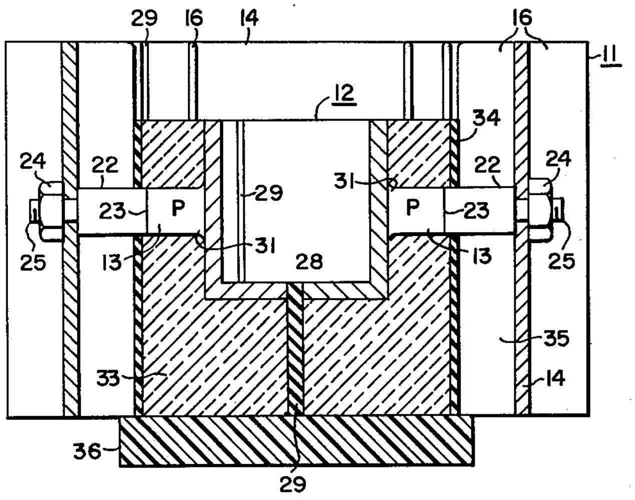
FIG. 3 is a vertical sectional view through the device taken generally as indicated by line III—III in FIG. 1.
Figures 4, 5, 6:
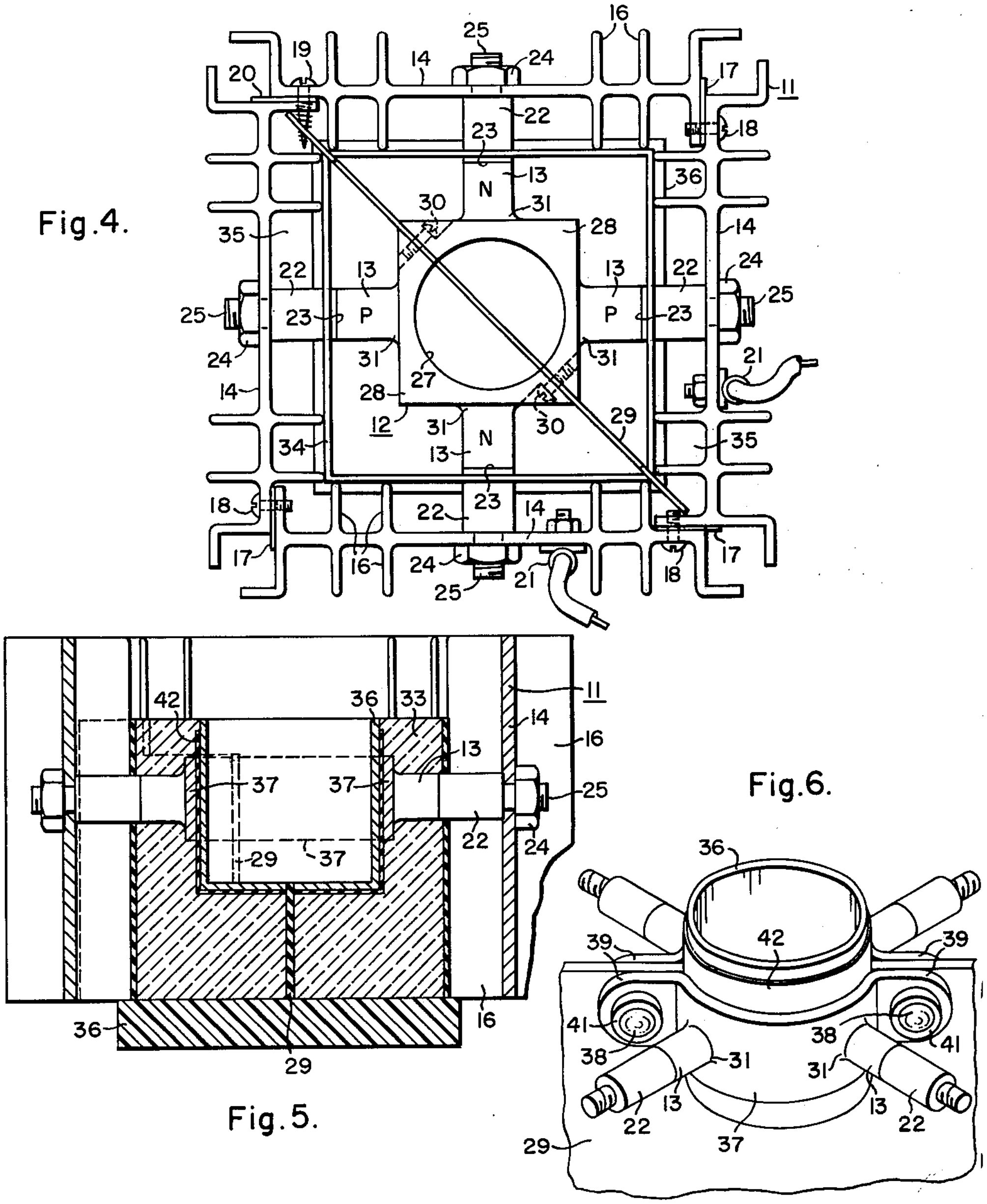
FIG. 4 is a plan view of the device with the thermal insulation removed to expose the thermoelectric bodies employed in the device.
FIG. 5 is a vertical sectional view similar to FIG. 3 but showing another structural arrangement for the specimen container.
FIG. 6 is a perspective view of the specimen container employed in the device of FIG. 5.

In the embodiment of the invention illustrated in FIGS. 1 to 4, the container 12 is also employed as a part of the electrical circuit for the thermal treatment device. As shown in FIGS. 2 and 4, the container 12 is formed from a straight-sided block of good thermally and electrically conductive material, such as copper. This block is hollowed out to provide a chamber 27 therein, and is preferably divided, or segmented, into parts 28, so that one part may be rendered electrically independent of the other part. A four-sided container, such as that illustrated in FIGS. 2 and 4, is preferably divided in a vertical plane passing diagonally through two vertical edges of the container, and the vertical sides, or faces, of the container are arranged substantially parallel to the planes of the shell plates 14 which they face. By this disposition, the container 12 may be conveniently supported within the shell 11 and its parts 28 electrically insulated from each other by means of an upright support sheet 29 formed of a rigid, electrically insulating material, such as glass reinforced silicone plastic. The support sheet 29 is diagonally disposed within the shell 11 and projects into corner portions of the shell where the ends thereof can be pierced by the screws 18 and 19 which hold their respective corners of the shell together. Portions of the support sheet 29 extend into the space between opposed surfaces of the container parts 28 where the container is divided into its parts. The container parts 28 are preferably clamped together by means of electrically insulating screws 30, or other suitable fasteners, in a manner to provide a fluid-tight joint between the container parts, with portions of the support sheet 29 serving as a gasket member. By virtue of this construction, the container 12, even though made in parts, or segments, can be employed for receiving fluid specimens without the necessity of providing a separate liner or separate inner container.

The thermoelectric bodies 13 employed in the device are of two types, being formed of two materials having different thermoelectric properties. The two types of bodies are distinguished in the drawings by the letters N and P, indicating, respectively, that the designated body is formed of a material having negative or positive thermoelectric properties.

Two dissimilar bodies 13 constitute a thermoelectric pair, or couple, when an end portion of one is electrically connected to an end portion of the other. The thermal treatment device shown in FIGS. 1 to 4 employs four thermoelectric bodies, or two thermoelectric couples, each composed of an N body and a P body. Each pair of bodies is electrically and thermally connected to one of the parts 28 of the container 12. These connections, or junctions, are identified by numeral 31 and are preferably made by soldering the ends of the bodies directly to the plane faces of the container 12.

In accordance with the invention, the individual thermoelectric bodies of each pair are connected to shell plates 14 which are electrically insulated from one another by strips 17. Certain adjoining plates 14 are electrically connected, as by shims 20, to provide an electrical circuit from one pair of thermoelectric bodies to another pair of thermoelectric bodies, and around, so to speak, the insulated joint between container parts 28. By this arrangement, a path for the flow of electric current through the device is provided which includes all of the thermoelectric bodies 13 and each of the shell plates 14 and the container parts 28.

The path for electric current through the device as it is viewed in FIG. 4 is as follows: Current entering the device through the shell plate 14 which is lowermost in the figure passes through this plate into an N type thermoelectric body 13, thence through the lower left-hand part 28 of container 12, out through a P type thermoelectric body into the left-hand shell plate 14, through shim 20 and screws 19 into the uppermost shell plate, thereafter through another N type thermoelectric body into the upper right-hand part 28 of the container, and out through the right-hand P type body to the right-hand shell plate 14.

This current flow path, incidentally, produces a cooling effect at junctions 31 between the thermoelectric bodies 13 and the container parts 28. Under these conditions the container parts 28 function as heat absorbing members. Heat removed from container 12 and its contents, together with such joule heat losses as occur in the system, are released at junctions 23 to plugs 22 and out to the shell plates 14, where this heat is dissipated to ambient air flowing over the shell plates and the fins 16 thereon. Reversing the direction of current flow through the system results in the transfer of heat in the opposite direction, from the shell plates 14 to the container 12.

In order to reduce the transfer of heat between the container 12 and the shell 11 in a direction opposite to that in which it is being pumped by the thermoelectric bodies 13, the container 12 is preferably surrounded on all sides and its bottom by a mass of thermal insulation 33, such as Fiberglas, foamed polystyrene, or the like. This thermal insulation is retained in place by means of sheets 34 of electrically and thermally insulated material which are spaced inwardly from the shell plates 14 in order to provide passageways 35 through which air may flow in contact with those fins 16 which project from the inner faces of the several plates 14. The entire thermal treatment device is preferably supported upon a base 36, the transverse dimensions of which are less than the distance between opposite shell plates 14, so that the bottom edges of the shell plates 14 are above the surface on which the device is placed and outwardly of the base to permit the free flow of air to or from air passages 35. The base 36 is formed of electrically and thermally insulating material, such as a plastic, for example, a phenolic resin.

In summarizing the several advantages of the thermal treatment device illustrated in FIGS. 1 to 4, it is to be noted that the shell 11, in addition to functioning as the main structural element of the device, also functions as a part of the thermal and electrical circuits for the thermoelectric system by virtue of the novel arrangement and connection of the several shell plates 14. The insulating sheet 29 provides a convenient, low-cost arrangement for supporting the container 12 in the shell 11, as well as the means for electrically insulating the container parts 28. The significance of providing fins 16 on both faces of the shell plates 14 can be appreciated when it is recognized that because the shell plates 14 are exposed they are subject to being damaged by accidental blows from surrounding objects. Dividing the required heat transfer area into two sets of fins 16, disposed inwardly and outwardly of the shell 11, results in the outwardly disposed fins being only half as wide as would be required were the entire fins disposed outside the shell. The narrower fins are stronger and, therefore, less likely to be damaged. Furthermore, those fins 16 which are disposed inwardly of the shell are protected by the relatively stronger plates 14.

*Embodiment of FIGS. 5 and 6*

The modification of the invention illustrated in FIGS. 5 and 6 employs the same shell 11 as that employed in the previously described embodiment of the invention, and the shell is, therefore, not shown in complete detail. This second embodiment of the invention differs from the first in the construction of the container for the specimens to be treated, which container is identified by the numeral 36. Here, the container 36 is a closed-end cylindrical member formed of metal, or other good heat conducting material. The container side walls and bottom wall are continuous so as to be fluid-tight.

Unlike the preceding embodiment of the invention, the container 36 does not form a part of the electrical circuit through the thermoelectric bodies 13. Instead, electrical connections between the individual bodies 13 of each of the pairs of bodies, or couples, are provided by semi-cylindrical straps 37, each of which is soldered or otherwise connected to its thermoelectric bodies 13 to provide junctions 31. The two straps 37 cooperate with support sheet 29 in supporting container 36 in shell 11, and for this purpose are arranged in circumferential relationship with the container 36. The container 36 is clamped between straps 37 by means of rivets 38, or other fasteners, passing through facing end portions 39 of the straps and through support sheet 29. The straps 37 are electrically insulated from each other by sheet 29 and insulating washers 41 which insulate rivets 38 from the straps. Additionally, container 36 is coated, or surrounded, with a thin film of electrical insulation 42 to prevent the container from shorting straps 37, but which preferably offers no substantial resistance to the flow of heat between the container 36 and the straps 37.

Straps 37 carry electric current in the same manner as the container parts 28 of the previously described embodiment of the invention and convey heat between junctions 31 and the container 36, so that an electrical current passing through the thermoelectric bodies 13, the straps 37 and the shell plates 14 produces either a heating or a cooling effect for the container 36.

The advantage of the junction strap arrangement of this embodiment of the invention over that previously described is that no electric current flows through the portions of the container 36 which may contact substances, or fluids, disposed in the container. Therefore, highly conductive liquids can be treated in container 36 without their interfering with proper functioning of the thermoelectric system. In addition, the solid walls of container 36 are less likely to develop leaks than the segmented container 12 of the first embodiment of the invention.

From the foregoing it should be apparent that this invention constitutes a novel approach to the design of thermoelectric thermal treatment devices. The several features of the invention, as described above, enable devices of this type to be constructed more economically and more compactly than was possible with design approaches heretofore in use.

While the invention has been described with reference to but two embodiments thereof, it will be obvious to those skilled in the art that it is not so limited, but is susceptible of various changes and modifications without departing from the spirit thereof.

What is claimed is:

1. In a device for performing thermal treatment, a container for a substance to be treated, a plurality of pairs of thermoelectric bodies surrounding said container in thermal transfer relationship therewith, the bodies of each pair being formed of dissimilar thermoelectric materials, a plural-sided shell encompassing said container and said bodies, each side of said shell comprising a plate of electrically and thermally conductive material, means electrically and thermally connecting a thermoelectric body to each of said shell plates, and means mechanically connecting adjacent plates to render said shell rigid, certain adjacent plates being electrically connected to each other and other adjacent plates being electrically insulated from each other to provide, at least in part, a series electrical circuit through each of said bodies and said shell plates.

2. In a device for performing thermal treatment, a container for a substance to be treated, said container comprising a plurality of circumferentially disposed heat-absorbing members, means electrically insulating said members from each other, a plurality of pairs of thermoelectric bodies surrounding said container, the bodies of each pair being formed of dissimilar thermoelectric materials, means electrically and thermally connecting each pair of bodies to different ones of said members, a plural-sided shell encompassing said container and said bodies, each side of said shell comprising a plate of electrically and thermally conductive material, and means electrically and thermally connecting a thermoelectric body to each of said shell plates, certain adjacent shell plates being electrically connected to each other and other adjacent plates being electrically insulated from each other to provide, at least in part, a series electrical circuit through each of said bodies, said container members and said shell plates.

3. In a thermal treatment device, a plural-sided shell, the sides of said shell each comprising a plate of thermally and electrically conductive material, means mechanically connecting edge portions of adjacent plates to render said shell rigid, an upright sheet of thermally and electrically insulating material diagonally disposed in said shell, means securing end portions of said sheet to said shell, a container disposed in said shell and carried by said sheet, a plurality of bodies alternately formed of two materials having dissimilar thermoelectric properties, said bodies being disposed in the space between said container and said shell in thermal transfer relationship with said container, means thermally and electrically connecting each of said bodies to different ones of said shell plates, means electrically insulating certain adjacent shell plates from each other and means electrically connecting other adjacent shell plates to each other to provide, at least in part, a series electrical circuit comprising each of said thermoelectric bodies and each of said shell plates, whereby upon the passage of electric current through said bodies heat is transferred between said container and said shell.

4. In a device for performing thermal treatment, a container for a substance to be treated, said container comprising a plurality of circumferentially disposed heat-absorbing members, means electrically insulating said members from each other, a plurality of pairs of thermoelectric bodies surrounding said container, the bodies of each pair being formed of dissimilar thermoelectric materials, means electrically and thermally connecting each pair of bodies to different ones of said members, a plural-sided shell encompassing said container and said bodies, each side of said shell comprising a finned plate of electrically and thermally conductive material, means electrically and thermally connecting a thermoelectric body to each of said shell plates, means mechanically connecting adjacent plates to render said shell rigid, certain adjacent shell plates being electrically connected to each other and other adjacent plates being electrically insulated from each other to provide a series electrical circuit through each of said bodies, said container members and said shell plates, electrically and thermally insulating means supporting said container in said shell, and means for conveying electrical current to two of said shell plates.

5. In a device for performing thermal treatment, a container for a substance to be treated, a plurality of pairs of thermoelectric bodies surrounding said container in thermal transfer relationship therewith, the bodies of each pair being formed of dissimilar thermoelectric materials, a plural-sided shell encompasisng said container and said bodies, each side of said shell comprising a plate of electrically and thermally conductive material, said shell having fins projecting from both faces thereof, means electrically and thermally connecting a thermoelectric body to each of said shell plates, means mechanically connecting adjacent plates to render said shell rigid, certain adjacent shell plates being electrically connected to each other and other adjacent plates being electrically insulated from each other to provide, at least in part, a series electrical circuit through each of said bodies and said shell plate, and thermal insulation between said container and said shell, said insulation being spaced inwardly from said shell to provide a passage for the flow of fluid over the fins on the faces of said plates which are disposed inwardly of said shell.

6. In a thermal treatment device, a shell formed of thermally conductive material, a container disposed within said shell in spaced relationship therewith, said container being formed of electrically and thermally conductive material and being divided in a vertical plane, a rigid sheet of electrically and thermally insulating material extending between said container and said shell for supporting said container in said shell, said sheet being disposed in the plane of division of said container and having portions thereof filling the space between mutually facing surfaces of said container at said division, means for clamping the parts of said container together with said portions of said sheet therebetween, at least one pair of thermoelectric bodies disposed within said shell for transferring heat between the container and the shell, the bodies of said pair being formed of dissimilar thermoelectric materials, and means thermally and electrically connecting said pair of bodies to one of the parts of said container to provide an electrical circuit between said bodies through said part of said container.

7. In a device for performing thermal treatment, a container for a substance to be treated, a shell encompassing said container, thermoelectric means disposed in heat transfer relationship with said container and said shell for transferring heat between the container and the shell, said shell being formed from thermally conductive material, said shell having extended heat transfer surfaces projecting from the outside and the inside surfaces thereof, and thermal insulation between said container and said shell, said insulation being spaced inwardly from said shell to provide a passage for the flow of fluid over the extended heat transfer surfaces disposed inside said shell.

8. In a thermal treatment device, a shell formed of thermally conductive material, a generally cylindrical container disposed within said shell in spaced relationship therewith, said container being formed of thermally conductive material, a pair of semicylindrical straps formed of electrically and thermally conductive material, said straps being arranged in encompassing relationship with said container, means for electrically insulating said straps from said container, a rigid sheet of electrically and thermally insulating material extending across said shell, said sheet having portions thereof disposed between mutually facing end portions of said straps, electrical insulation means for securing the end portions of one strap to the end portions of the other strap with said portions of said sheet therebetween, at least one pair of thermoelectric bodies disposed in said shell for transferring heat between the container and the shell, the bodies of said pair being formed of dissimilar thermoelectric materials, and means thermally and electrically connecting said pair of bodies to one of said straps to provide an electrical circuit between said bodies through said strap.

References Cited in the file of this patent

UNITED STATES PATENTS 2,922,284 Danielson ------------- Jan. 26, 1960